United States Patent
Shibata et al.

(10) Patent No.: US 6,492,191 B2
(45) Date of Patent: Dec. 10, 2002

(54) METHOD FOR MANUFACTURING AN $Al_xGa_yIn_zN$ FILM USING A METAL FILM FOR HEAT RADIATION

(75) Inventors: Tomohiko Shibata, Kasugai (JP); Keiichiro Asai, Nagoya (JP); Teruyo Nagai, Nagoya (JP); Mitsuhiro Tanaka, Taketoyo-cho (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/812,618

(22) Filed: Mar. 20, 2001

(65) Prior Publication Data

US 2002/0028343 A1 Mar. 7, 2002

(30) Foreign Application Priority Data

Mar. 24, 2000 (JP) .......................... 2000-084064
Feb. 28, 2001 (JP) .......................... 2001-054786

(51) Int. Cl.$^7$ ................................ H01L 21/00
(52) U.S. Cl. .................................... 438/46
(58) Field of Search ............................ 438/46

(56) References Cited

U.S. PATENT DOCUMENTS 6,335,217 B1 * 1/2002 Chiyo et al. .................. 438/46

* cited by examiner

Primary Examiner—Richard Elms
Assistant Examiner—Beth E. Owens
(74) Attorney, Agent, or Firm—Burr & Brown

(57) ABSTRACT

A semiconductor device has a substrate body, an $Al_xGa_yIn_zN$ (x+y+z=1; x,y,z≧0) film epitaxially grown directly on the substrate body or epitaxially grown via a buffer layer on the substrate body, and a metal film provided on the lower surface of the substrate body. During manufacture of the semiconductor device, the substrate body is heated uniformly and efficiently by thermal radiation of a heater.

5 Claims, 3 Drawing Sheets

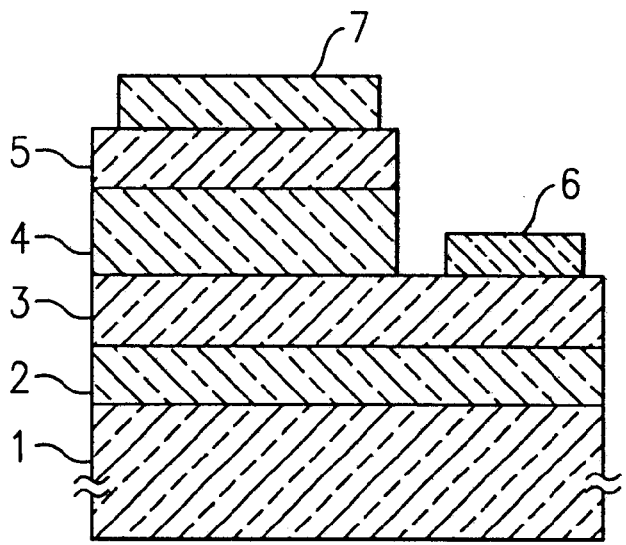
FIG. 1 - Prior Art
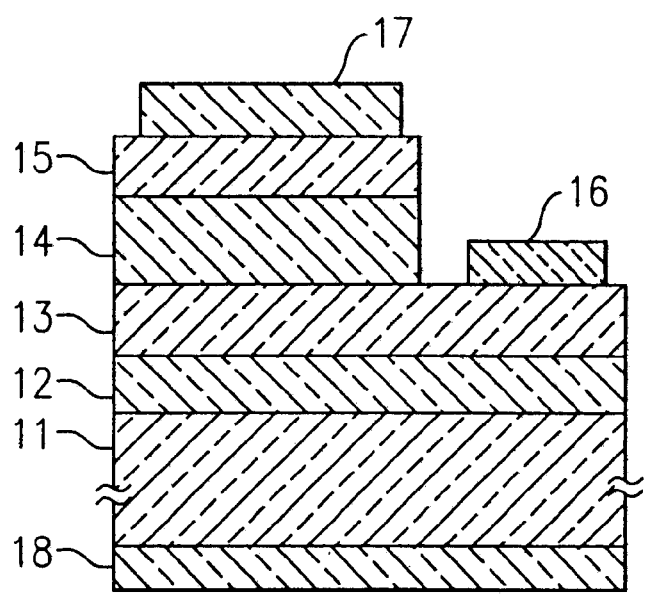
FIG. 2

METHOD FOR MANUFACTURING AN $Al_xGA_yIN_zN$ FILM USING A METAL FILM FOR HEAT RADIATION

BACKGROUND OF THE INVENTION (1) Field of the Invention

This invention relates to a semiconductor device including a substrate body made of sapphire, SiC or GaN, etc. and an $Al_xGa_yIn_zN$ film (x+y+z=1; x,y,z≧0) formed directly on the substrate body or formed via a buffer film on the substrate body, a manufacturing method of the same and an epitaxial growth substrate for the same.

(2) Related Art Statement

At the present time, a semiconductor device such as a light emitting diode (LED), a laser diode (LD) or a field effect transistor (FET) is well known. Particularly, in the case of producing such a light emitting diode, an $Al_xGa_yIn_zN$ film (x+y+z=1; x,y,z≧0) is epitaxially grown directly on the substrate body or epitaxially grown via a buffer film on a substrate body made of sapphire, SiC or GaN, etc. Since the $Al_xGa_yIn_zN$ film has a larger band gap, it can generate and emit a short wavelength light.

FIG. 1 is a cross sectional view showing a light emitting diode structure to emit a blue light having the $Al_xGa_yIn_zN$ film. In the depicted light emitting diode, a GaN 2 film as a buffer layer is formed on a substrate body 1 made of a C-sapphire crystal ($Al_2O_3$) by a MOCVD method at low temperature, and an n-type $Al_xGa_yIn_zN$ film 3 is epitaxially grown on the GaN film 2 by a MOCVD method. Then, a p-type $Al_xGa_yIn_zN$ film 4 is epitaxially grown on the n-type $Al_xGa_yIn_zN$ film 3 by a MOCVD method, and a low resistive $Al_xGa_yIn_zN$ film 5 is epitaxially grown on the n-type $Al_xGa_yIn_zN$ film 4 by a MOCVD method. Electrodes 6 and 7 are provided on the n-type $Al_xGa_yIn_zN$ film 3 and the p-type $Al_xGa_yIn_zN$ film 5, respectively.

In this case, the n-type $Al_xGa_yIn_zN$ film 3 is grown with keeping the substrate body 1 and the buffer layer 2 at 1000° C. and over for improving the crystallinity and the flatness thereof. Therefore, a heater structure and a heater material having high thermal efficiency are desired in order to heat a given substance uniformly. The buffer layer 2 should be also composed of the above GaN film 2 or an AlN film formed at a low temperature to improve the crystallinity and the flatness of the n-type $Al_xGa_yIn_zN$ film 3. Moreover, a nitride layer formed at a surface of the substrate body may be employed as the buffer layer.

However, the substrate body may not often be heated to a desired temperature depending on the film growth conditions such as gas pressures and gas flow rates of raw materials. As a result, the n-type $Al_xGa_yIn_zN$ film 3 cannot have good crystallinity and flatness. Moreover, the crystallinity and the flatness of the n-type $Al_xGa_yIn_zN$ film 3 may fluctuate due to non-uniform heating of the substrate body.

Particularly, in the case of forming an Al-rich $Al_xGa_yIn_zN$ (x+y+z=1; x≧0.5, y, z≧0) film, the above-mentioned matters become conspicuous. The first reason is because a carrier gas ($H_2$, $NH_3$) with raw material gases must be delivered at a fast flow rate of almost 1L/minute or more under a depressurized atmosphere of almost 100 Torr or less, to reduce the collision ratio of the elements of the raw material gases and thus repress, in the gas phase, the reaction between the elements of the Al raw material gas and the N raw material gas.

The second reason is because particularly in the case of forming the above Al-rich $Al_xGa_yIn_zN$ (x+y+z=1; x≧0.5, y, z≧0) film, the substrate body is heated to 1100° C. or greater, to improve its crystallinity and flatness through lateral epitaxial growth.

When the $Al_xGa_yIn_zN$ film is formed at the above fast gas flow rate under the above depressurized atmosphere in a CVD apparatus, the degree of heat radiation from a surface of the substrate body increases in the case of heating the substrate body with a heater. Therefore, the heater must be heated to a higher temperature than the desired substrate temperature by 100° C. or more. As a result, excess load is applied to the heater, and thus, the heater is degraded and the lifetime is shortened. Moreover, the surface of the substrate body may not be heated uniformly.

It is considered that the heating mechanism of the substrate body by the heater is originated from the thermal conduction due to the direct contact between the heater and the substrate body, the thermal conduction through the atmosphere gas composed of the above carrier gas, and the thermal conduction due to heat radiation. In this case, however, since the $Al_xGa_yIn_zN$ film is formed under a depressurized atmosphere, the thermal conduction through the atmosphere gas does not substantially contribute the heating mechanism. Moreover, since the substrate body is made of a transparent material such as sapphire and thus does not almost absorb infrared light, the thermal conduction due to heat radiation does not effectively contribute to the heating mechanism. As a result, it turns out that the heating mechanism is originated from the thermal conduction due to the direct contact between the heater and the substrate body. Therefore, if the substrate body is not set on a susceptor of the heater so as to contact the surface of the susceptor entirely, the substrate body is not heated to the desired temperature entirely. Moreover, since the carrier gas including the raw material gases is delivered at the above fast flow rate, the heat radiation is brought about remarkably. Furthermore, the substrate body may be warped during the substrate body heating. Consequently, the substrate body is not heated sufficiently by the heater.

The above phenomena are observed when the $Al_xGa_yIn_zN$ film is formed on a SiC substrate body or a GaN substrate body. Then, the above phenomena become conspicuous in a visible light-near infrared light range of 500 nm–2000 nm wavelength. As mentioned above, in the past, the surface of the substrate body is not heated uniformly under fast gas flow rate conditions, the depressurized atmosphere or the high film growth temperature-film forming, and thus, the $Al_xGa_yIn_zN$ film cannot have good crystallinity and flatness. Then, excess load is applied to the heater, and thus, the lifetime of the heater is shortened.

SUMMARY OF THE INVENTION

It is an object of the present invention to provide a semiconductor device having, on a substrate body, an $Al_xGa_yIn_zN$ film (x+y+z=1; x,y,z≧0) with good crystallinity and flatness through a small amount of defect.

It is another object of the present invention to provide a manufacturing method of the semiconductor device having the $Al_xGa_yIn_zN$ film (x+y+z=1; x,y,z,≧0) with good crystallinity and flatness through uniform heating of the substrate body.

It is still another object of the present invention to provide an epitaxial growth substrate suitable for the above semiconductor device.

This invention relates to a semiconductor device including a substrate body, at least one $Al_xGa_yIn_zN$ (x+y+z=1; x,y,z≧0) film epitaxially grown directly on the upper surface of the substrate body or epitaxially grown via a buffer layer on the upper surface of the substrate body, and a metal film provided on the lower surface of the substrate body.

In a preferred embodiment of the semiconductor device of the present invention, the substrate body is made of a material having a transmissivity of 50% or more within a wavelength range of 400 nm–800 nm. Moreover, the metal film formed on the lower surface of the substrate body is made of a high melting point metal of almost 1200° C. or greater, such as W, Ta, Mo, Ti, Be or Mn.

Moreover, in another preferred embodiment of the semiconductor device of the present invention, an Al-rich $Al_xGa_yIn_zN$ (x+y+z=1; x≧0.5, y, z≧0) film is formed on the substrate body. Then, the buffer layer is composed of the $Al_xGa_yIn_zN$ film (x+y+z=1; x,y,z≧0).

This invention also relates to a method for manufacturing a semiconductor device including the steps of:

setting a substrate body with a metal film on the lower surface thereof into a CVD apparatus, introducing raw material gases with a given carrier gas onto the upper surface of the substrate body; and heating the substrate body via the metal film, thereby to epitaxially grow at least one $Al_xGa_yIn_zN$ (x+y+z=1; x,y,z≧0) film directly on the upper surface of the substrate body or via a buffer layer on the upper surface of the substrate body.

In a preferred embodiment of the manufacturing method of the semiconductor device, the total gas flow rate is set to 1L/minute or over. Moreover, the interior pressure of the MOCVD apparatus is set to 100 Torr or less. Then, a metal film having a high melting point of almost 1200° C. or more is formed on the lower surface of the substrate body. Particularly, the above condition is more suitable for manufacturing the $Al_xGa_yIn_zN$ film having an Al concentration of 50 atomic % or greater (x≧0.5).

This invention also relates to an epitaxial growth substrate comprising a substrate body, at least one $Al_xGa_yIn_zN$ (x+y+z=1; x,y,z≧0) film epitaxially grown directly on the upper surface of the substrate body or epitaxially grown via a buffer layer on the upper surface of the substrate body, and a metal film provided on the lower surface of the substrate body.

In a preferred embodiment of the epitaxial growth substrate of the present invention, the substrate body has a transmissivity of 50% or more within a wavelength range of 400 nm–800 nm. Moreover, the metal film formed on the lower surface of the substrate body is made of a high melting point metal of approximately 1200° C. or more such as W, Ta, Mo, Ti, Be or Mn. Then, the buffer layer is composed of the $Al_xGa_yIn_zN$ film (x+y+z=1; x,y,z≧0).

According to this invention, the substrate body is heated via the metal film formed on the lower surface thereof by the heater. Since the metal film absorbs infrared light, the substrate body is heated uniformly by the heat radiation of the metal film, and thus, is heated to a desired temperature efficiently. Therefore, when the $Al_xGa_yIn_zN$ film (x+y+z=1; x,y,z≧0) is formed on the substrate body, it can have good crystallinity and flatness. Moreover, excess load is not applied to the heater, and the lifetime of the heater may be elongated.

BRIEF DESCRIPTION OF THE DRAWINGS

For better understanding of the present invention, reference is made to the attached drawings, wherein:

FIG. 1 is a cross sectional view showing a conventional light emitting diode structure;

FIG. 2 is a cross sectional view showing a semiconductor device according to the present invention;

DETAILED DESCRIPTION OF THE INVENTION

Figure 3:
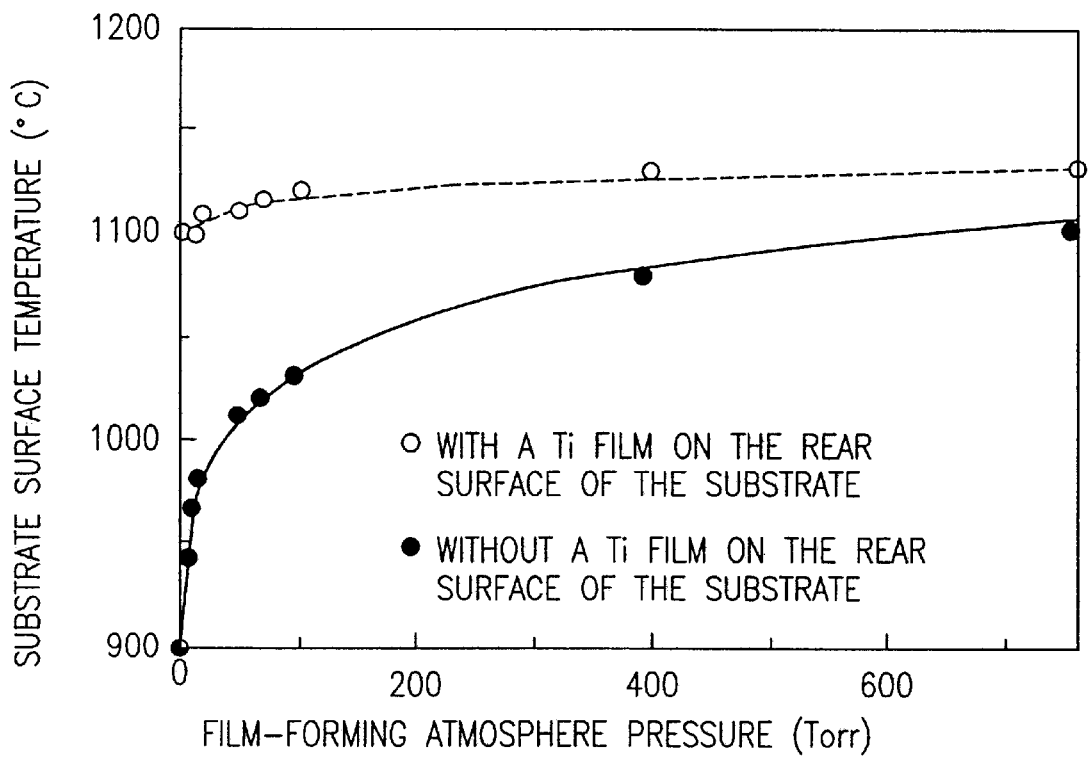
FIG. 3 is a graph showing the relation between a upper surface temperature of a substrate body and a film growth pressure in a CVD apparatus.

FIG. 2 is a cross sectional view showing a semiconductor device to generate and emit a blue light according to the present invention. The depicted semiconductor device has a similar structure to the one shown in FIG. 1, fundamentally. An $Al_xGa_yIn_zN$ film (x+y+z=1; x,y,z≧0) film 12 as a buffer layer is formed on a substrate body 11 made of a C-sapphire crystal ($Al_2O_3$) by a MOCVD method at low temperature, and an n-type $Al_xGa_yIn_zN$ film (x+y+z=1, x,y,z≧0) 13 is epitaxially grown on the $Al_xGa_yIn_zN$ film 12 by a MOCVD method. Then, a p-type $Al_xGa_yIn_zN$ film (x+y+z=1; x,y,z≧0) 14 is epitaxially grown on the n-type $Al_xGa_yIn_zN$ film 13 by a MOCVD method, and a low resistive $Al_xGa_yIn_zN$ film (x+y+z=1; x,y,z≧0)15 is epitaxially grown on the p-type $Al_xGa_yIn_zN$ film 14 by a MOCVD method. Electrodes 16 and 17 are provided on the n-type $Al_xGa_yIn_zN$ film 13 and the low resistive $Al_xGa_yIn_zN$ film 15, respectively.

Then, a high melting point metal film 18 made of W, Mo, Ta, Ti, Be, Mn or the like is formed on the lower surface of the sapphire substrate body 11. The metal film 18 has a high melting point of 1200° C. and over. Then, the thickness of the metal film 18 is set to 0.1 μm, for example. As a result, the metal film has a sufficient heat resistance for the heating process of the substrate body when forming the above $Al_xGa_yIn_zN$ films.

FIG. 3 is a graph showing the relation between an upper surface temperature of the substrate body and a film growth pressure in the CVD apparatus. In this case, the total flow rate of the raw material gas and the carrier gas is set to be 1L/minute, and the susceptor temperature is set to be 1150° C. The solid line designates the relation between the upper surface temperature and the film growth pressure of a substrate body with a Ti film on the lower surface of the substrate body, and the broken line designates the relation between the upper surface temperature and the film growth pressure of a substrate body without the Ti film.

In both of the above substrate bodies, the upper surface temperature is decreased as the film growth pressure is decreased. However, the decreasing degree of the upper surface temperature of the substrate body with the Ti film designated by the solid line is smaller than that of the substrate body without the Ti film designated by the broken line. For example, when the film growth pressure is set to be 100 Torr, the difference in the upper surface temperatures between the substrate bodies with and without the Ti film approaches to 100° C. or over.

Therefore, by forming a metallic film, such as the Ti film, on the lower surface of the substrate body, the upper surface temperature of the substrate body can be maintained at a higher temperature, irrespective of the film growth pressure. As a result, in the case of setting the film growth pressure to 100 Torr, for example, the heating temperature of the heater can be reduced by almost 100° C. if the substrate body has the Ti film on the lower surface thereof.

Figure 4A:
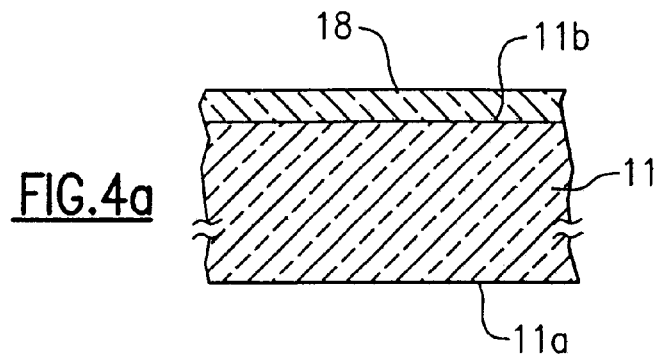
FIGS. 4a–4c are cross sectional views showing successive steps in a manufacturing method of a semiconductor device according to the present invention.
Figure 4B:
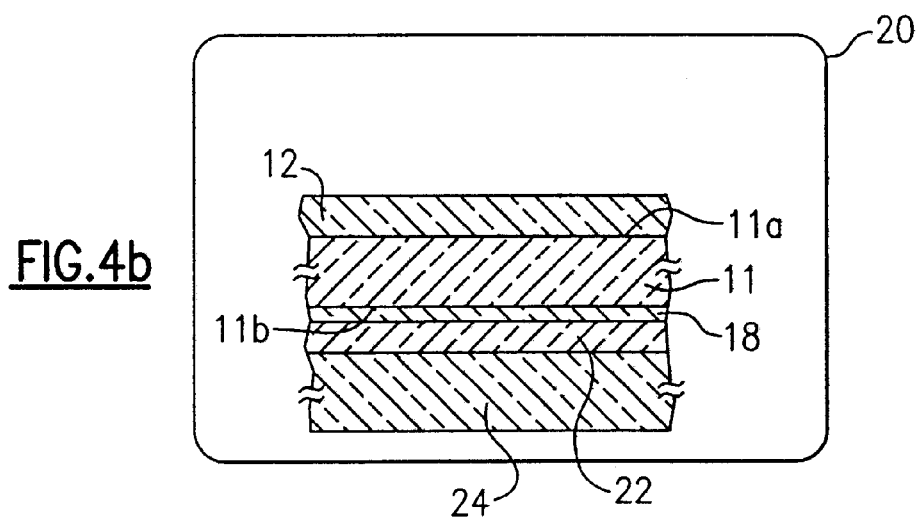
Figure 4C:
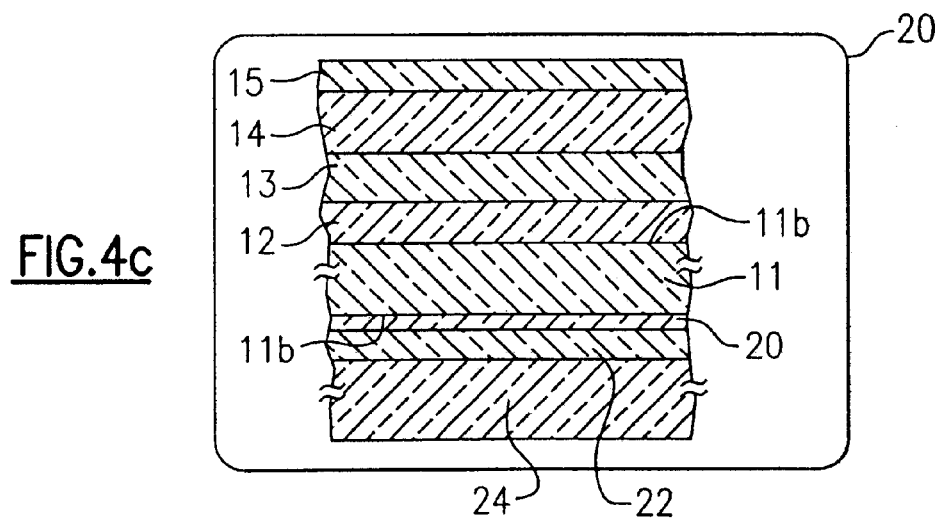

FIGS. 4a–4c are cross sectional views showing successive steps in a manufacturing method of a semiconductor device according to the present invention. First, as shown in FIG. 4a, the high melting point metal film 18 is formed, for example in a thickness of 0.1 μm, on the lower surface 11b of the C-sapphire substrate by sputtering.

Then, as shown in FIG. 4b, the sapphire substrate body 11 is set into a MOCVD apparatus 20 so that the metal film 18 faces a heater 22 on a susceptor 24. Then, the $Al_xGa_yIn_zN$ film 12 is epitaxially grown on an upper surface 11a of the substrate body 11. The sapphire substrate body 11 is heated by the heater 22 through the thermal conduction of the direct contact between the heater 22 and the sapphire substrate body 11 and the thermal radiation of the metal film 18. Therefore, the sapphire substrate body 11 is heated efficiently, and thus, heated to a desired temperature easily. As a result, the excess load for the heater 22 is reduced and the lifetime of the heater is elongated, which enables easy maintenance of the MOCVD apparatus 20 including the heater 22 and reduces the manufacturing costs for the semiconductor device.

In the case of forming the buffer layer 12 of the Al-rich $Al_xGa_yIn_zN$ (x+y+z=1; x≧0.5, y, z≧0) film, it is desired that the total gas flow rate of the carrier gas of $H_2$ or $NH_3$ including the raw material gases is set to approximately 1L/minute, and the interior pressure of the MOCVD apparatus 20 is set to approximately 100 Torr. In this case, a very fast gas flow is brought about around the sapphire substrate body 11, and thus, large heat radiation may occur at the sapphire substrate body 11. However, since the sapphire substrate body 11 has the metal film 18 on the lower surface 11b, it can be heated to the desired temperature through the direct contact thermal conduction and the thermal radiation without excess load for the heater 22. As a result, the Al-rich $Al_xGa_yIn_zN$ buffer layer 12 can have good crystallinity and flatness.

Subsequently, as shown in FIG. 4c, the $Al_xGa_yIn_zN$ films 12–15 are epitaxially grown by MOCVD methods.

Although the present invention was described in detail with reference to the above examples, this invention is not limited to the above disclosure and every kind of variation and modification may be made without departing from the scope of the present invention. For example, the substrate body 11 may be made of SiC, GaN or AlGaN/sapphire, instead of the above C-sapphire substrate. Moreover, the metal film 18 may be made of an alloy film or a nitride film of the above high melting point metal such as W, Mo, Ta, Ti, Be or Mn. And moreover, the semiconductor device may be applied to other semiconductor devices, such as ultraviolet light-emitting diodes, laser diodes and field effect transistors.

Moreover, in the semiconductor device of the present invention, the buffer layer 12 may be omitted. Then, the above metal film 18 may be removed after the semiconductor device is completed. Furthermore, the metal film 18 may be used as the electrode. Then, the metal film 18 may be made of an alloy material of the above high melting point metal, a nitride film having a high melting point of 1200° C. or more, or a multilayered film composed of the above high melting point metal. The alloy film and the nitride film may have a composition gradient therein.

Moreover, in the above embodiment, although the $Al_xGa_yIn_zN$ film is epitaxially grown under a depressurized atmosphere of 100 Torr or less, it may be done under a normal pressurized atmosphere. Then, instead of the above MOCVD method, a HVPE method using a chlorine based gas may be employed.

As mentioned above, according to this invention, the semiconductor device having, on the substrate body, the $Al_xGa_yIn_zN$ film (x+y+z=1; x,y,z≧0) with good crystallinity and flatness and a small amount of defects can be provided. Therefore, the semiconductor device can be applied in various semiconductor devices, such as light-emitting diodes, laser diodes, field effect transistors.

Moreover, the epitaxial growth substrate suitable for the above semiconductor device is provided. Therefore, the above semiconductor device is easily formed by epitaxial growth.

Moreover, the method suitable for manufacturing the above semiconductor device is provided. According to the manufacturing method of the present invention, the substrate body is heated through the thermal radiation of the metal film provided on the lower surface thereof, and thus, heated to the desired temperature efficiently.

What is claimed is:

1. A method for manufacturing a semiconductor device comprising the steps of:

setting a substrate body with a metal film on a lower surface thereof into a CVD apparatus;

introducing raw material gases with a given carrier gas onto an upper surface of the substrate body; and heating the substrate body via the metal film, thereby to epitaxially grow at least one $Al_xGa_yIn_zN$ (x+y+z=1; x,y,z ≧0) film directly on the upper surface of the substrate body or on a buffer layer on the upper surface of the substrate body.

2. A method for manufacturing a semiconductor device as defined in claim 1, wherein a total gas flow rate including the raw material gases and the carrier gas is set to 1 L/minute or greater, and then, the at least one $Al_xGa_yIn_zN$ (x+y+z=1; x,y,z≧0) film is epitaxially grown directly on the upper surface of the substrate body or on the buffer layer on the upper surface of the substrate body.

3. A method for manufacturing a semiconductor device as defined in claim 1, wherein an interior pressure of the CVD apparatus is set to 100 Torr or below, and then, the at least one $Al_xGa_yIn_zN$ (x+y+z=1; x,y,z≧0) film is epitaxially grown directly on the upper surface of the substrate body or on the buffer layer on the upper surface of the substrate body.

4. A method for manufacturing a semiconductor device as defined in claim 1, wherein the at least one $Al_xGa_yIn_zN$ film has an Al concentration of 50 atomic % or greater (x≧0.5).

5. A method for manufacturing a semiconductor device as defined in claim 1, wherein the metal film provided on the lower surface of the substrate body comprises a metallic material having a high melting point of 1200° C. or greater.

* * * * *